United States Patent
Kitsunai et al.

(10) Patent No.: US 7,567,422 B2
(45) Date of Patent: Jul. 28, 2009

(54) PLASMA PROCESSING APPARATUS AND PLASMA PROCESSING METHOD

(75) Inventors: Hiroyuki Kitsunai, Kasumigaura (JP); Seiichiro Kanno, Kodaira (JP); Tsunehiko Tsubone, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 331 days.

(21) Appl. No.: 11/214,861

(22) Filed: Aug. 31, 2005

(65) Prior Publication Data

US 2007/0035908 A1 Feb. 15, 2007

(30) Foreign Application Priority Data

Aug. 10, 2005 (JP) ............... 2005-232608

(51) Int. Cl.
*H01T 23/00* (2006.01)
(52) U.S. Cl. .................. 361/234; 361/230
(58) Field of Classification Search .......... 361/230–234
See application file for complete search history.

(56) References Cited

U.S. PATENT DOCUMENTS 5,557,215 A * 9/1996 Saeki et al. ............ 324/765
5,933,314 A * 8/1999 Lambson et al. ............ 361/234
6,304,424 B1 * 10/2001 Mett et al. .................. 361/234

FOREIGN PATENT DOCUMENTS

| JP | 11-330217 | 11/1999 |
|----|-----------|---------|
| JP | 2002-83860 | 3/2002 |

* cited by examiner

*Primary Examiner*—Danny Nguyen
(74) *Attorney, Agent, or Firm*—Antonelli, Terry, Stout & Kraus, LLP.

(57) ABSTRACT

In the plasma processing apparatus including a processing chamber for plasma-processing a processed substrate, plasma generating unit that generates plasma in the processing chamber, and a wafer stage which is mounted in the processing chamber and has an electrostatic chuck for holding the processed substrate, a current detector that detects a current value of leakage current flowing in a circuit formed of a power supply for electrostatic attraction, an electrostatic chuck, a substrate, plasma, a grounded line, and a controlling unit which sets an attraction condition to the current value and controls the applied voltage so that the leakage current reaches the set current value are included.

7 Claims, 5 Drawing Sheets

PLASMA PROCESSING APPARATUS AND PLASMA PROCESSING METHOD

The present application is based on and claims priority of Japanese patent application No. 2005-232608 filed on Aug. 10, 2005, the entire contents of which are hereby incorporated by reference.

BACKGROUND OF THE INVENTION

1. Field of the Invention

The present invention relates to a semiconductor manufacturing technology. More specifically, the invention relates to a plasma processing apparatus that attracts a substrate by an electrostatic force and a plasma processing method using the plasma processing apparatus.

2. Description of the Related Art

In a plasma processing apparatus for forming a thin film or performing plasma etching in a semiconductor manufacturing process, an electrostatic chuck is used as equipment that holds a processed substrate (hereinafter, simply referred to as a substrate), such as a semiconductor wafer in a predetermined position. Since the electrostatic chuck may generate an attractive force over an entire rear surface of the substrate, a temperature controlling function such as a heater or a cooling device is provided in the electrostatic chuck and thus a substrate stage having an excellent temperature control property can be realized.

However, in the electrostatic chuck, even after a voltage application is stopped, it is difficult to separate the substrate from the electrostatic chuck due to the charge remaining on the substrate. Particularly, this phenomenon is important in the electrostatic attracting stage using Johnson-Rahbeck effect, which is employed in most of electrostatic chucks, since a large attractive force can be obtained with a low voltage. The Johnson-Rahbeck effect is to obtain a large attractive force by allowing minute current to flow through an interface between the surface of the electrostatic chuck and the substrate to store a large amount of charge in a narrow gap of the interface. That is, by storing the charge in the gap of the interface or the substrate, a large attractive force can be realized. However, it is difficult to separate the substrate from the electrostatic chuck when the remaining charge is not removed.

With respect to this phenomenon, various solutions have been conventionally suggested. A method of applying a voltage reverse to a voltage at the time of attraction to remove the charge remaining on the semiconductor wafer was suggested. This method is generally known as a remaining charge removing method (for example, see Japanese Unexamined Patent Application Publication No. 11-330217).

Furthermore, a method of bringing a grounded conductor into contact with a semiconductor wafer and allowing charge to escape to separate the semiconductor wafer from an electrostatic chuck was suggested (for example, see Japanese Unexamined Patent Application Publication No. 2002-83860). In addition, a method of applying an AC voltage to an electrostatic chuck and a method of ejecting inert gas on a surface between a semiconductor wafer and a surface of a chuck to separate the semiconductor wafer from the chuck are known.

However, according to the method of applying the reverse voltage to the substrate disclosed in Japanese Unexamined Patent Application Publication No. 11-330217, it is difficult to set a value of the applied voltage or an applying time. That is, in this method, since the reverse voltage is applied to the substrate, an attraction force due to the reverse voltage may likely be generated. In Japanese Unexamined Patent Application Publication No. 11-330217, by obtaining a condition that the remaining quantity of reverse charge becomes zero in each electrostatic chuck, this problem was avoided. However, since the substrate itself is a portion of an electrostatic attracting circuit at the time of the actual use, the condition that the remaining quantity of charge becomes zero is affected by a film kind or a film structure of the substrate. That is, in this method, when the condition that the remaining quantity of charge becomes zero is obtained by only the electrostatic chuck, an optimal value for separating the substrate may not be obtained.

Next, according to the method of directly grounding the substrate to allow the charge to escape disclosed in Japanese Unexamined Patent Application Publication No. 2002-83861, since the wafer of the substrate is stripped by a mechanical force, it is impossible to completely remove the possibility of deviation or cracking of the wafer. Conventionally, in the electrostatic attracting stage of the plasma processing apparatus, the attracting condition is set to the voltage and the voltage is set to a constant value regardless of a kind of the substrate. As disclosed in Japanese Unexamined Patent Application Publication No. 11-330127, an optimal value is obtained in each electrostatic chuck stage. That is, research to obtain an optimal value for an individual difference of the electrostatic chuck stage has progressed, but electrical characteristics such as resistance of the substrate itself has not been considered.

SUMMARY OF THE INVENTION

An advantage of the invention is that it provides a plasma processing apparatus and a plasma processing method, which can easily separate a substrate after the substrate held by using electrostatic attraction is processed.

In a plasma processing apparatus, the above-mentioned object is accomplished by including a current detector that detects a current value of leakage current flowing in a circuit formed of a power supply for electrostatic attraction, an electrostatic chuck, a substrate, plasma, a grounded line, that is, a current value of leakage current of the electrostatic chuck (hereinafter, referred to as a leakage current) and a controlling unit which sets an attraction condition to the current value and controls the voltage (hereinafter, referred to as electrostatic attraction voltage) applied to the electrostatic chuck so that the leakage current reaches the set current value.

In a plasma processing apparatus, the above-mentioned object is accomplished by including a current detector that detects a current value of leakage current flowing in a circuit formed of a power supply for electrostatic attraction (hereinafter, referred to as attraction power supply), an electrostatic chuck, a substrate, plasma, a grounded line, that is, a current value of leakage current of the electrostatic chuck (hereinafter, referred to as leakage current) and a controlling unit which sets an attraction condition to a plurality of current values and controls the electrostatic attraction voltage and the applied time of the electrostatic attraction voltage so that the leakage current reaches the set current value during any time of the substrate process.

Furthermore, in the plasma processing apparatus, the above-mentioned object is accomplished by including a function for acquiring a relationship between the current value flowing between the electrostatic chuck and the substrate and the voltage applied to the electrostatic chuck during the substrate process and a function for storing the relationship and displaying the result.

Also, in the plasma processing apparatus, the above-mentioned object is accomplished by setting the leakage current value during a substrate processing time using a sample substrate, for example, a substrate composed of film attachment for checking a process shape and a photomask and determining the electrostatic attraction voltage having the leakage current value.

Moreover, in the plasma processing apparatus, the above-mentioned advantage is accomplished by including a function for acquiring a relationship between the current value flowing between the electrostatic chuck and the substrate and the voltage applied to the electrostatic chuck, detecting a difference from the set value, and storing and displaying information concerning the difference.

Furthermore, in the plasma processing apparatus, the above-mentioned advantage is accomplished by including a function for setting an allowable difference value from the leakage current set value and a function for issuing an alarm when the difference from the leakage current set value exceeds the allowable value.

As described above, after a substrate is held by electrostatic attraction and processed, the substrate can be easily separated, and thus product failure is reduced and productivity can be improved.

DESCRIPTION OF THE PREFERRED EMBODIMENTS

Figure 1:
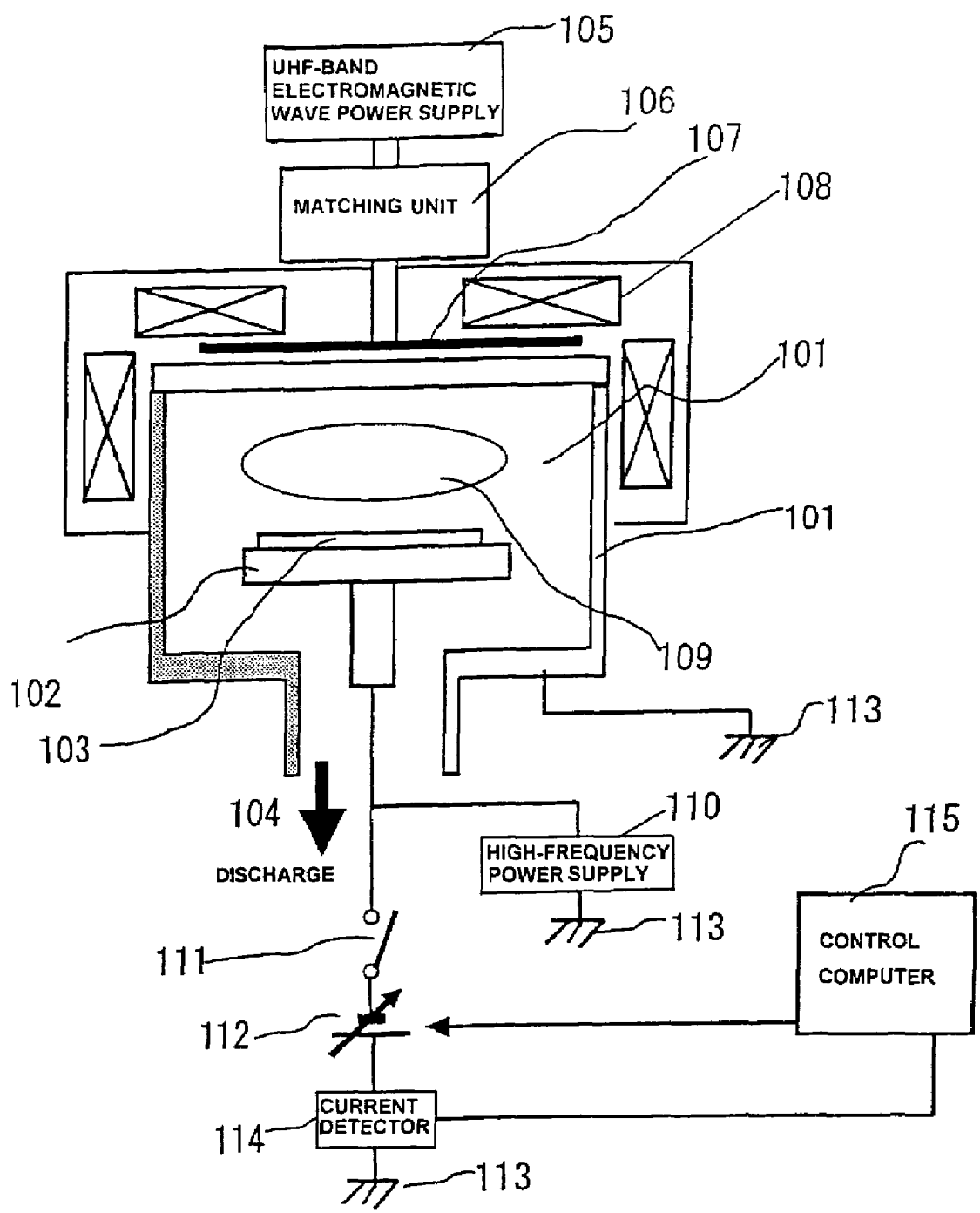
FIG. 1 is a schematic view illustrating a structure of a semiconductor manufacturing apparatus according to a first embodiment of the invention.
Figure 2:
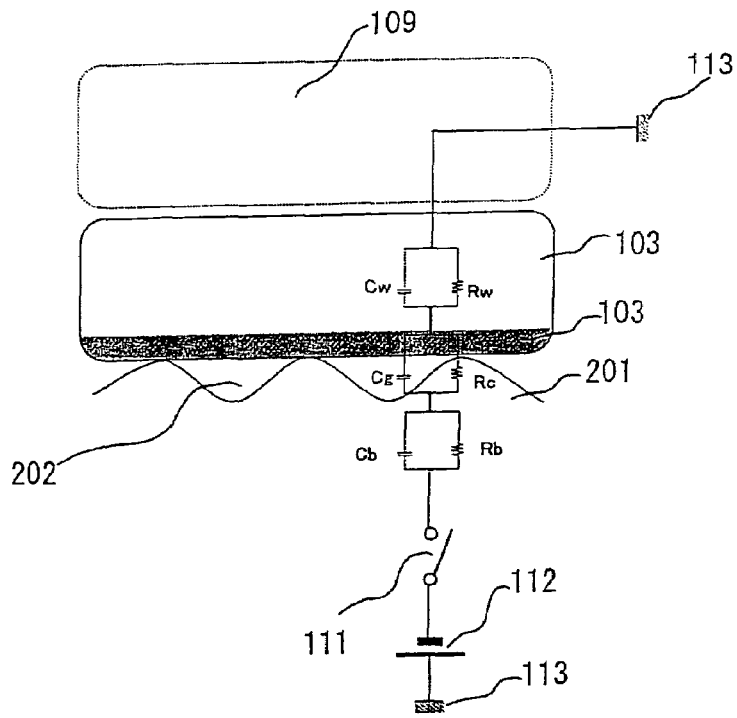
FIG. 2 is a schematic view illustrating an equivalent circuit of a circuit in which a leakage current flows between an electrostatic chuck and a substrate according to the embodiment of the invention.

Hereinafter, the preferred embodiments of the invention will be described in detail. First, a first embodiment of the invention will be described with reference to the accompanying drawings. FIG. 1 is a view showing a dry etching device used when performing a plasma processing method of the invention, which is an example of a device using electron cyclotron resonance (ECR). FIG. 2 is a diagram showing an equivalent circuit of an electrostatic chuck and a substrate in respect to a leakage current.

In FIG. 1, the dry etching device includes an etching processing chamber 101 having a processing chamber wall 101', a substrate stage 102 which can electrostatically attract a substrate 103 having an electrostatic chuck mounted in the etching processing chamber 101, a discharging port 104 for vacuum-discharging the etching processing chamber 101 at a predetermined pressure, a UHF band electromagnetic wave power supply 105, a matching unit 106, an antenna 107, a solenoid coil 108, a high-frequency power supply 110, a switch 111 for performing ON/OFF operation, a DC power supply 112 for electrostatic attraction (attraction power supply), a ground 113, a current detector 114, and a control computer 115. Plasma 109 is formed in the etching processing chamber 101.

In FIG. 1, at the time of an etching process, first, the etching processing chamber 101 is adjusted to a predetermined pressure by vacuum discharging. Next, electromagnetic waves in the UHF band are introduced into the etching processing chamber 101 from the electromagnetic wave power supply 105 through the matching unit 106 and the antenna 107. The introduced electromagnetic waves are resonated with a magnetic field formed by the solenoid coil 108 to convert the gas introduced into the processing chamber plasma, and then an etching process is performed using the plasma 109. For the purpose of control of the processing shape, a RF bias is applied to the substrate stage 102 on which a Si substrate is mounted by the high-frequency power supply 110. The current detector 114 measures the value of a current flowing through a circuit formed by the electrostatic attraction power supply 112, the electrostatic chuck of the substrate stage 102, the substrate 103, the plasma 109, and the processing chamber wall 101', that is, the leakage current value of the electrostatic chuck. The control computer 115 controls a voltage of the DC power supply 112 of the electrostatic chuck on the basis of the measured current value.

In the plasma etching apparatus having the above-mentioned structure, first, the processed substrate 103 is mounted on the substrate stage 102 and then the etching gas is introduced to maintain the predetermined pressure. Thereafter, the UHF power is applied from the UHF-band electromagnetic wave power supply 105 to generate the plasma 109 and the etching is performed for a predetermined time. The predetermined voltage is applied from the DC power supply 112 to the electrostatic chuck of the substrate stage 102 to generate an attractive force. In the present embodiment, a unipolar electrostatic chuck is illustrated as an example. By generating the plasma 109, a circuit is formed with the DC power supply 112, the switch 111, the electrostatic chuck 102, the Si substrate 103, the plasma 109, and the processing chamber wall 101' which has the same potential as the ground 113, and the leakage current flows therethrough. Thus, the Si substrate is attracted to the electrostatic chuck.

As described above, in the substrate stage using the electrostatic chuck, the attractive force due to the charge remaining on the substrate remains even though voltage application is stopped and thus a phenomenon that the substrate cannot be separated is generated. In the above electrostatic chuck method, the electrostatic chuck using Johnson-Rahbeck effect is mainly used, because a large attractive force can be obtained by a low voltage.

Here, the electrostatic attraction using the Johnson-Rahbeck effect will be described referring to FIG. 2. The electrostatic chuck is made by laminating an electric conductor and an insulating dielectric film 201. Since the surface of the electrostatic chuck, that is, the surface of the dielectric film 201 is uneven, it actually has minute irregularities and gaps 202 formed thereon. Since the rear surface of the substrate 103 is better than the surface of the dielectric film 201 in respect to surface finishing precision, the contact between the irregularities of the dielectric film 201 and the plane of the rear surface of the substrate 103 can be exemplified in model. As equivalent circuit can be exemplified by a parallel circuit of resistance Rb and capacitance Cb of the dielectric film 201, a parallel circuit of contact resistance Rc of the rear surface of the substrate 103 and a concave portion of the dielectric film 201 and capacitance Cg of the gap 202 formed by the rear surface of the substrate 103 and the irregularities of the dielectric film 201, and a parallel circuit of resistance Rw and capacitance Cw of the substrate 103 can be exemplified as model of a serial-connected circuit.

The electrostatic chuck using the Johnson-Rahbeck effect is characterized in that the dielectric film 201 is made of a material having a relatively low resistivity of $10^{10}$ to $10^{12}$ Ωcm, and minute current (leakage current) flows between the surface of the electrostatic chuck, that is, the surface of the dielectric film and the substrate. Since bulk resistance Rb of the dielectric film 201 is low, Rb<Rc is realized and the applied voltage is efficiently applied to Rc. Here, since the gap is very narrow due to the surface roughness, a large amount of charge can be stored in the capacitance Cg and a large attractive force can be realized by a relative low voltage such as several hundreds of volts.

However, when the plasma process is terminated to separate the substrate, if the switch 111 is turned off, or the plasma 109 is dissipated, the line to the ground 103 is not available. Therefore, the charge stored on the capacitance Cw of the surface of the substrate and the capacitance Cg of the gap enter the floating state, and the charge is dissipated by the time constant of the contact resistance Rc. Since the time constant is determined by the resistance Rc, when the leakage current is large, it takes a long time to dissipate the charge.

For example, when a wafer is used as the Si substrate, the resistance Rw of the substrate is substantially consistent and the contact resistance Rc is also consistent, and thus the same separating property is realized even if there is not an individual difference of the electrostatic chuck, that is, the dielectric film 201. However, in an actual Si substrate, various films having different electrical characteristics are plurally formed on the surface of the substrate, and various films 103' inserted when forming the film on the surface are formed on the rear surface. Since the films vary according to a kind of the processed product or which process is performed, the resistance Rw of the substrate 103 and the contact resistance Rc between the surface of the electrostatic chuck and the substrate becomes various values. That is, substrates having various de-electrification characteristics are provided for the plasma processing apparatus.

Here, the invention is characterized in that a current detector that detects the leakage current value flowing through the circuit formed by the electrostatic attraction power supply 112, the electrostatic chuck dielectric film 201, the substrate 103, and the plasma 109, and the ground 103, and an applied voltage control unit that controls the applied voltage so that the attraction condition is set to the leakage current and the set current value is realized are provided.

Figure 3:
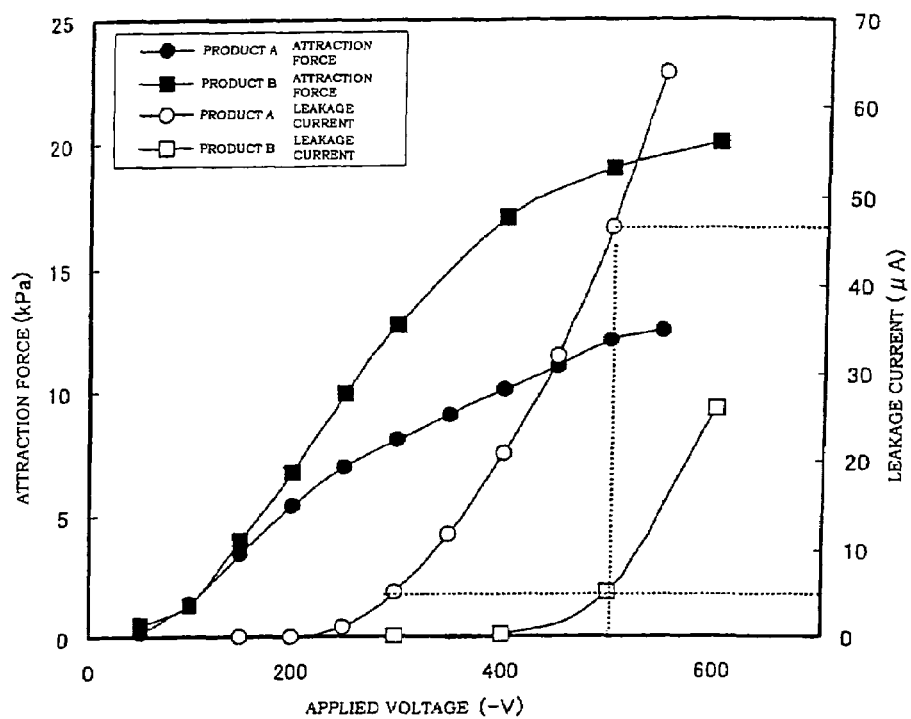
FIG. 3 is a diagram illustrating behaviors of voltage-current and voltage-attractive force of the electrostatic chuck according to the embodiment of the invention.

According to experiments by the inventors, two kinds of products A and B in which the film structures of the rear surfaces of the substrates are different from each other, and the current, the voltage, and the attractive force characteristics as shown in FIG. 3 can be obtained. The leakage current rapidly increases at a point when the applied voltage exceeds any value, and any voltage value is different according to the kind of the product used, that is, the kind of the film of the rear surface of the substrate. On the other hand, in the attractive force, when the applied voltage increases, the attractive force increment ratio is reduced the closer it becomes to the voltage value in which the leakage current value increases. That is, the resistance Rw of the substrate 103 and the contact resistance Rc between the surface (dielectric film) of the electrostatic chuck 201 and the film 103' of the rear surface of the substrate have voltage dependency, the resistance value is reduced when the voltage increases and thus the leakage current is apt to flow. Also, since a ratio of the voltage applied to the contact resistance Rc is reduced, the attractive force increment ratio is reduced when the voltage increases.

As described above, when the voltage is applied to the electrostatic chuck, the charge stored in the capacitance Cw of the rear surface of the substrate and the capacitance Cg of the gap escape by a time constant due to the contact resistance Rc. The more leakage current flow, the more charge remains and thus the time required for separating the substrate is longer. That is, from a point exceeding any voltage, the more leakage current flows by voltage increment, the more difficult it is to separate the substrate, causing the attractive force increment to be reduced.

Next, as the result of evaluating substrate deviation accompanied by the operation of carrying the substrate, the results shown in Table 1 are obtained. Conventionally, the applied voltage is −500 V as the attraction condition and the substrate deviation due to the remaining attractive force is often generated only at the time of processing the product A. Accordingly, when the applied voltage is lower to −250 V so as to have the same current value as the product B, the substrate deviation due to the remaining attractive force is not generated.

TABLE 1

|  | Product A | Product B |
| --- | --- | --- |
| −250 V | Wafer deviation is not generated | Wafer deviation is not generated |
| −500 V | Wafer deviation is generated | Wafer deviation is generated |

The invention did not perform the substrate attraction at a constant voltage, and includes the current detector that detects the leakage current value and the applied voltage control unit which uses the electrostatic attraction voltage having the optimal leakage current value as the applied voltage condition, thereby obtaining the plasma processing apparatus which can easily separate the substrate.

Figure 4:
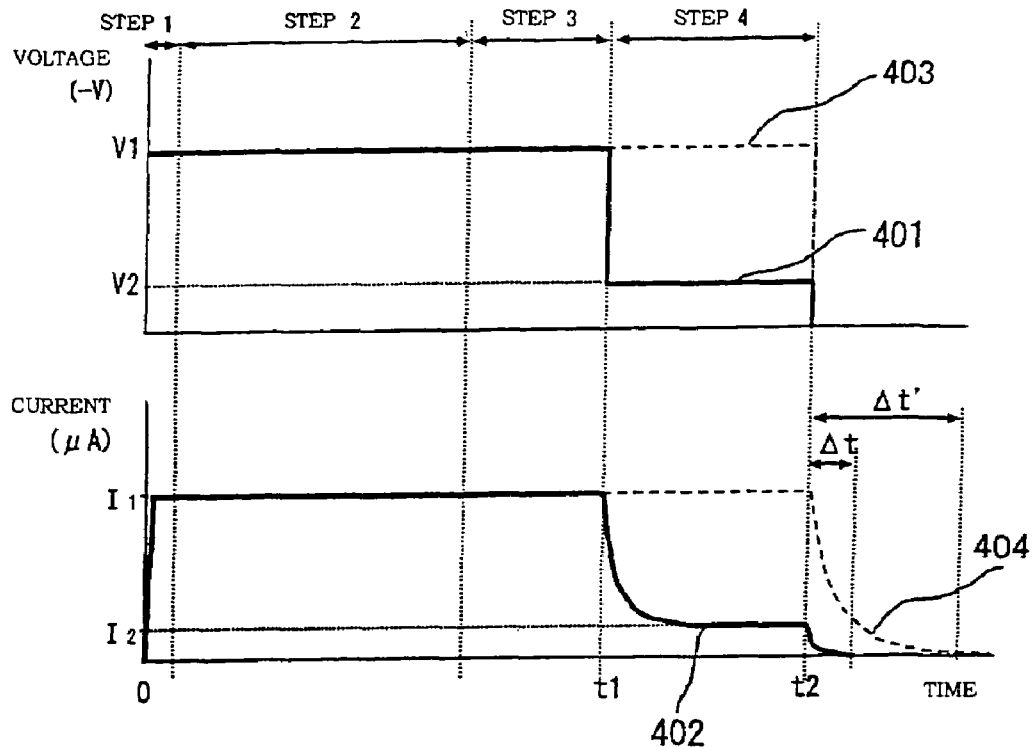
FIG. 4 is a timing chart for controlling a leakage current and an applied voltage of an electrostatic chuck according to a second embodiment of the invention.

Next, a second embodiment of the invention will be described with reference to FIG. 4. FIG. 4 is a timing chart of the electrostatic attraction voltage (applied voltage) and the leakage current value when the substrate 103 is attracted to the substrate stage 102 (electrostatic chuck). Generally, when the wiring lines on the Si substrate are dry-etched, they are etched under different several conditions, not in the same condition. The timing chart of FIG. 4 illustrates an example of the dry etching process and includes a break-through step (step 1) of extracting an oxide layer of a surface of a wiring layer, a main etching step (step 2) for etching the wiring layer, a just etching step (step 3) for etching the wiring layer at an etching rate slower than the main etching rate so that the base of the wiring lines is not excessively etched and for detecting an end, and an over etching step (step 4) of removing a step in a chip. The main etching step may be divided or the break-through step and the main etching step may become the same step, according to the different kinds of the wiring layers.

The present embodiment is characterized in that a current detector that detects the leakage current flowing between the electrostatic chuck and the substrate, and an applied voltage control unit that sets a plurality of leakage current values during a substrate processing time and controls an applied voltage so that the set current values are obtained are provided. In FIG. 4, when the above-mentioned product A is etched, from the beginning of the etching step to the finishing of the just etching step after finishing the main etching step, the electrostatic attraction voltage V1 (−500 V) is set so as to have the leakage current I1 (45 μA) and the substrate is attracted, and, after finishing of the just etching step, the electrostatic attraction voltage V2 (−300 V) is set so as to have the leakage current I2 (5 μA) (in the drawing, voltage change 401 and current change 402). As described above, when application of the electrostatic attraction voltage is stopped, the current value is reduced by the time constant due to the contact resistance Rc between the electrostatic chuck dielectric film 201 and the substrate 103 and the resistance Rb of the dielectric film 201. Since the current value represents the remaining charge, if the current value is not sufficiently reduced, the substrate is not easily separated, which may cause deviation or cracking of the substrate.

As in the related art, when the attraction is performed with a constant voltage value of −500 V until the finishing of the over etching step (in the drawing, voltage change 403 and current change 404), after the electrostatic attraction voltage is turned off, the current value at the time of applying a voltage of −500 V is reduced and a time Δt' is required for sufficiently exhausting the remaining charge. According to the present embodiment, at the time of finishing the just etching step, the current value is set to I2 μA, and, in this case, the electrostatic attraction voltage is V2. Thus, during the over etching step, the leakage current value is reduced from I1 μA to I2 μA, the time when the charge is removed from the time when the application of the electrostatic attraction voltage of the electrostatic chuck is stopped can be set to Δt shorter than the Δt' in the related art. Although, in the present embodiment, the set value of the leakage current is changed after the just etching step, in the case of the product having a short over etching time, the set value of the leakage current changes at a rapid time. Also, the set value of the leakage current may be lowered by dividing the step into several steps.

In the present embodiment, since the set value of the leakage current is set to a value I2 μA suitable for separating the substrate in the step before the application of the voltage of the electrostatic chuck is stopped, in the previous step, the applied voltage may be controlled so that the leakage current becomes any current value or the applied voltage is not controlled by the leakage current value and any constant voltage value is applied similar to the voltage application in the related art and then the set value of the leakage current is set to a value suitable for separating the substrate, thereby obtaining the same effect.

Figure 5:
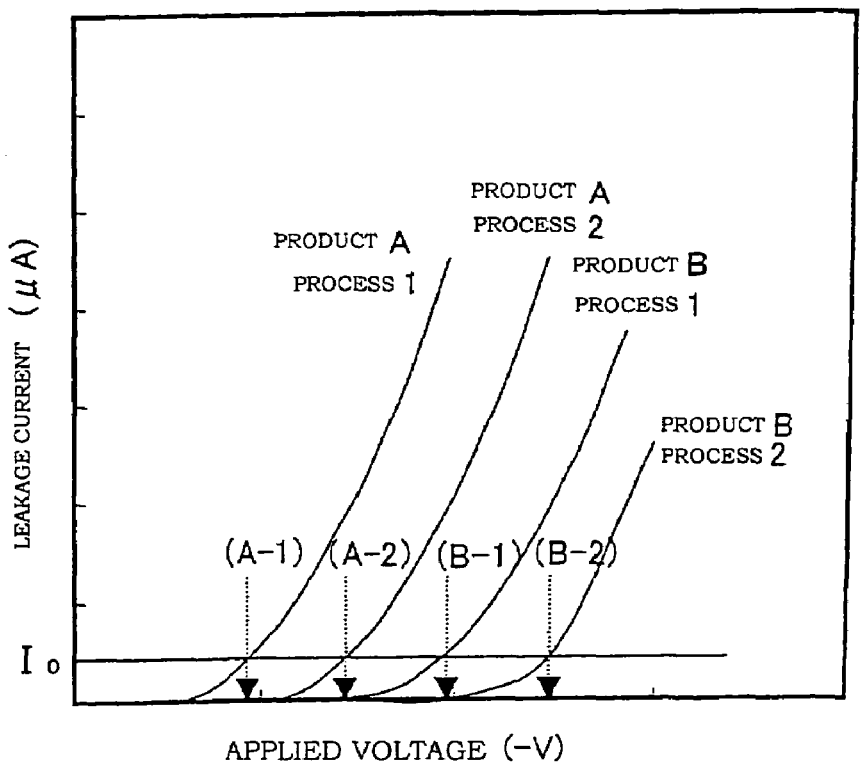
FIG. 5 illustrates a relationship between an applied voltage and leakage current of the electrostatic chuck according to the invention in each product and process.

A third embodiment of the invention will be described with reference to FIG. 5. As described in FIG. 1, by including a detecting/measuring unit (current detector) that detects the leakage current of the electrostatic chuck and a storing unit, the electrostatic attraction voltage (applied voltage)-leakage current characteristic for the product substrate can be obtained. As described above, if the products or the processes are different from each other, the kinds and the structures of the film of the rear surface of the substrate are different from each other and thus the electrostatic attraction voltage-leakage current characteristics are also different. For example, as shown in FIG. 5, the electrostatic attraction voltage-leakage current characteristic is obtained in each product or process so that a storing/displaying function is applied to the control computer 115 of the plasma processing apparatus and a function for setting a desired leakage current value or the electrostatic attraction voltage (applied voltage) value corresponding to the desired leakage current value is applied, the process can be performed easier than the first and second embodiments. As shown in FIG. 5, as the process 1 of the product A, the process 2 of the product A, the process 1 of the product B, the leakage current-electrostatic attraction voltage characteristic can be displayed and thus the leakage current set value can be selected and set for each product and process. That is, by including a displaying function and a function for inputting the leakage current as the process condition with such data, an apparatus operator can easily select and set the leakage current value.

Also, after the substrate is carried into the processing apparatus and mounted on the substrate stage to generate the plasma, the voltage of the electrostatic attraction power supply of the electrostatic chuck gradually increases so that a process recipe for automatically obtaining and storing the leakage current-electrostatic attraction voltage (applied voltage) characteristic as shown in FIG. 5, thereby easily obtaining optimal set values A-1, A-2, B-1, and B-2 of the applied voltage having optimal leakage currents in each product or process. Also, when obtaining the leakage current-electrostatic attraction voltage characteristic as shown in FIG. 5, the characteristic can be more accurately obtained using the product substrate itself. However, even when the sample substrate having the same kind and the same structure of the film is used, the same result can be obtained.

Figure 6:
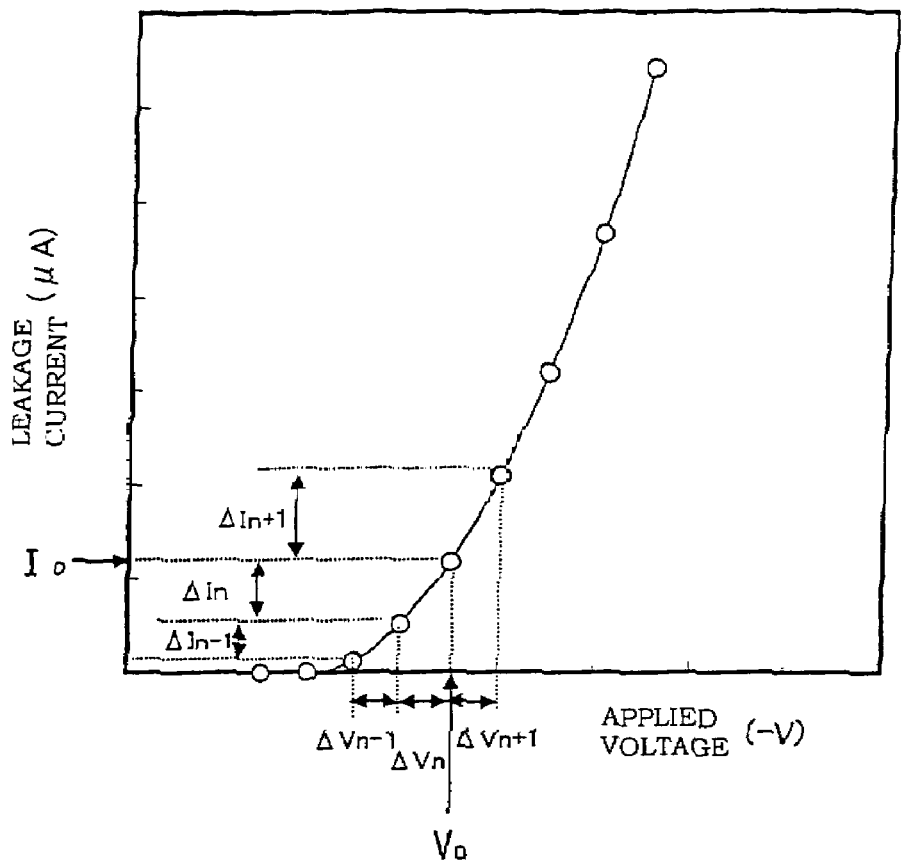
FIG. 6 illustrates a relationship between an applied voltage and a leakage current of an electrostatic chuck according to another embodiment of the invention.

Another embodiment of the invention will be described with reference to FIG. 6. As shown in FIG. 6, the electrostatic attraction voltage (applied voltage) value increases by an increment ΔV, the increasing value ΔI of the leakage current is obtained and stored, and the displaying function is applied to the control computer 115 of the plasma processing apparatus. Thereby, when the leakage current value rapidly increases, the leakage current value and the applied voltage value can be obtained. For example, in FIG. 6, the voltage increases by ΔV. Here, ΔVn−1, ΔVn, and ΔVn+1 are described so as to match the measured current value to a symbol, and ΔV=ΔVn−1=ΔVn=ΔVn+1. Also, in the case of a function for registering the increment ΔI of any leakage current value as a reference value and storing and displaying the leakage current value and the electrostatic attraction voltage value when exceeding the reference value, that is, ΔI<ΔIn, if a function for storing and displaying the leakage current value Io and the electrostatic attraction value Vo is applied, the limited leakage current value or the electrostatic attraction voltage value can be easily obtained.

In the present embodiment, by obtaining a relationship between the leakage current value and the applied voltage in each processed substrate and process, the optimal attraction condition can be directly set in the processed substrate and process, without obtaining only the set leakage current value or the electrostatic attraction voltage value. When attracting the substrate, the applied voltage increases by an increment ΔV, and when the increasing value of the current value at this time exceeds the increment ΔI of the predetermined current value, the voltage is set to the applied voltage Vo. Thereby, the optimal leakage current value and the electrostatic attraction voltage value can be set for each substrate and the automatic attraction condition can be set.

Figure 7:
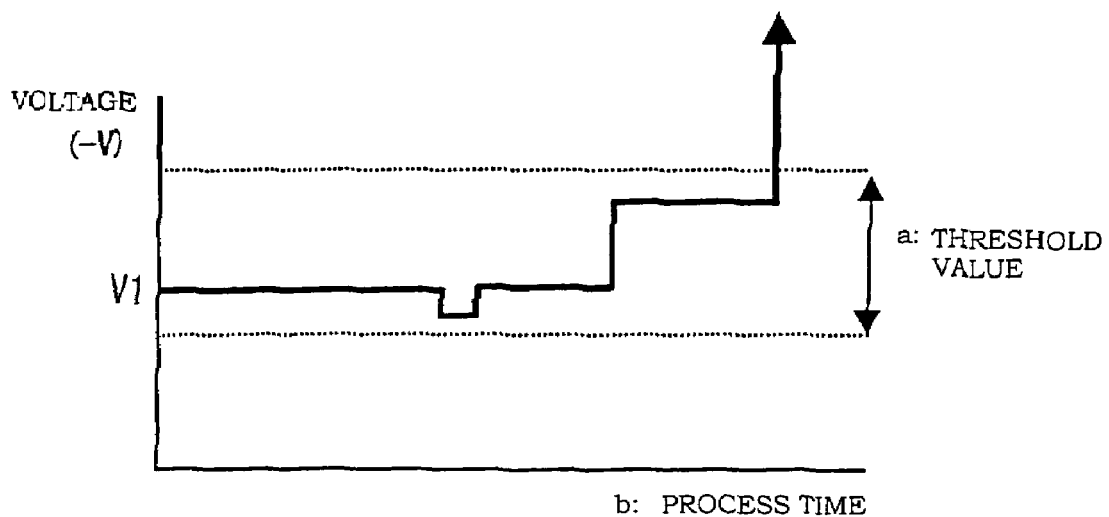
FIG. 7 illustrates variation of the applied voltage according to the lapse of a processing time (frequency) in the electrostatic chuck of the invention.

Next, another embodiment of the invention will be described with reference to FIGS. 7 and 8. While the semiconductor manufacturing apparatus such as the dry etching device is used for the mass production, the characteristic may be changed with the passage of time as the processed number increases. For example, in the process atmosphere after the dry etching process of each substrate is completed, the reaction product accompanied by the etching remains and is attached to the surface of the electrostatic chuck. That is, by attaching the attachment to the surface, at the time of mass production, the contact resistance may be changed with the passage of time. According to the invention, the attraction condition is set by the leakage current value flowing between the electrostatic chuck and the substrate and the voltage which reaches the leakage current value is set to the electrostatic attraction voltage (applied voltage). Also, the relationship between the leakage current value flowing between the electrostatic chuck and the substrate and the electrostatic attraction voltage applied to the electrostatic chuck is obtained and the control unit that stores the relationship and the function for displaying the result are included. For example, since the voltage value of the set current value during the process shown in FIG. 7 can be stored and displayed, it may be used as a reference which determines how much the attachment is attached to the surface of the electrostatic chuck or how much the characteristic is changed. Here, a threshold value (allowable value) of the electrostatic attraction voltage value is set, and, if the electrostatic attraction voltage value exceeds the threshold value, an alarm is displayed to notify to the apparatus operator the abnormal state. Further, monitoring and storing the voltage value which reaches a certain current value helps analyze the failure level for the processed substrate. For example, in a hole processing step, by observing a voltage data corresponding to a wafer having a non-opening, it can be determined whether the electrostatic chuck is the cause of the abnormal.

Figure 8:
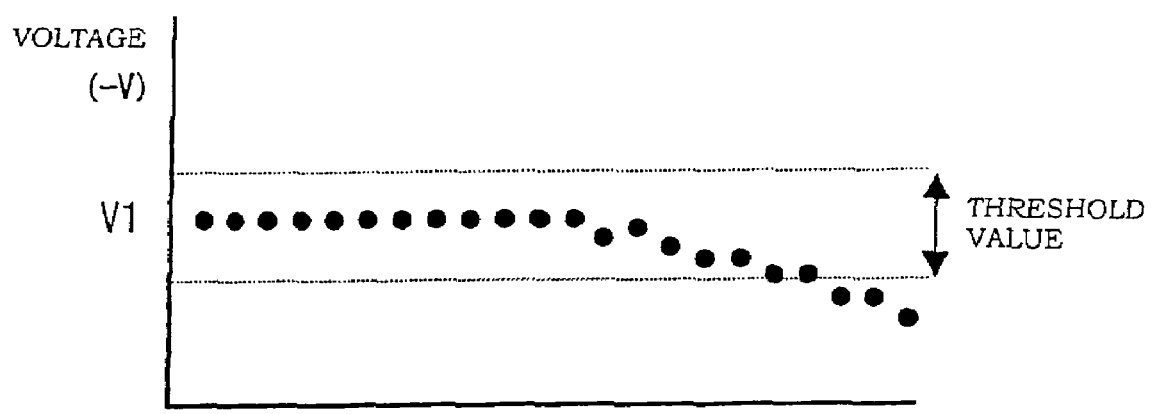
FIG. 8 illustrates variation of the applied voltage according to the lapse of a processing time (frequency) in the electrostatic chuck of the invention.

Also, as shown in FIG. 8, by applying a function for calculating, storing, and displaying an average value of the electrostatic attraction voltage values during the substrate process, a change or consistency of the electrostatic chuck performance change for a long time can be checked. Also, by storing and displaying a maximum value, a minimum value, and an amplitude (maximum value-minimum value) in addition to the average value, the change in performance can also be checked. Thereby, the apparatus operator can know the time when the maintenance such as the cleaning of the surface of the electrostatic chuck or the replacing of the electrostatic chuck is needed. Similar to that described in FIG. 7, the threshold value (allowable value) of the electrostatic attraction voltage value is set, and, if the electrostatic attraction voltage exceeds the threshold value, a function for displaying the alarm may be included.

Here, when a plurality of current values are set as described in FIG. 4, it is preferable that the electrostatic attraction voltage value for the set leakage current value is monitored.

What is claimed is:

1. A plasma processing apparatus comprising:
   a processing chamber that plasma-processes a processed substrate;
   a plasma generating unit that generates plasma in the processing chamber;
   a wafer stage which is mounted in the processing chamber and has an electrostatic chuck for holding the processed substrate;
   a DC power supply that applies an electrostatic attraction voltage to the electrostatic chuck;
   a current detector that detects a current value of leakage current flowing between the electrostatic chuck and the processed substrate; and
   an applied voltage controlling unit which sets a plurality of values of the leakage current during a substrate processing time, and which sets a plurality of attraction conditions of the processed substrate to the leakage current values to control the voltage applied to the electrostatic chuck and the applied time so that the leakage current has the set current values; and
   an attraction characteristic acquiring unit that acquires and stores a relationship between the leakage current and the applied voltage during the processing and displays the result.

2. The apparatus according to claim 1,
   wherein the leakage current value is set to a low current value at a time closest to the finishing time of the substrate process.

3. A plasma processing apparatus comprising:
   a processing chamber that plasma-processes a processed substrate;
   a plasma generating unit that generates plasma in the processing chamber;
   a wafer stage which is mounted in the processing chamber and has an electrostatic chuck for holding the processed substrate;
   a DC power supply that applies an electrostatic attraction voltage to the electrostatic chuck;
   a current detector that detects a current value of leakage current flowing between the electrostatic chuck and the processed substrate;
   an applied voltage controlling unit which sets an attraction condition to the leakage current values to control the voltage applied to the electrostatic chuck and the applied time so that the leakage current has a set current value; and
   an attraction characteristic acquiring unit that acquires and stores a relationship between the leakage current and the applied voltage during the processing and displays the result;
   wherein the applied voltage controlling unit increases the applied voltage by a predetermined increment, an upper limit value of the increment ΔI of the leakage current value corresponding to the increment of the applied voltage is previously set to a threshold value in the attraction characteristic acquiring unit, and when the increment ΔI of the leakage current value exceeds the threshold value, the current value and the voltage value are stored.

4. A plasma processing apparatus comprising:
   a processing chamber that plasma-processes a processed substrate;
   a plasma generating unit that generates plasma in the processing chamber;
   a wafer stage which is mounted in the processing chamber and has an electrostatic chuck for holding the processed substrate;
   a DC power supply that applies an electrostatic attraction voltage to the electrostatic chuck;
   a current detector that detects a current value of leakage current flowing between the electrostatic chuck and the processed substrate;
   an applied voltage controlling unit which sets an attraction condition to the leakage current value to control the voltage applied to the electrostatic chuck and the applied time so that the leakage current has a set current value; and
   an attraction characteristic acquiring unit that acquires and stores a relationship between the leakage current and the applied voltage during the processing and displays the result;
   wherein the applied voltage controlling unit increases the applied voltage by any increment which can be selected, an upper limit value of the increment ΔI of the leakage current value corresponding to the increment of the applied voltage is previously set to a threshold value in the attraction characteristic acquiring unit, and, when the increment ΔI of the leakage current value exceeds the threshold value, the current value and the voltage value are stored and, when the increment ΔI of the leakage current value exceeds the threshold value, the voltage becomes the applied voltage.

5. A plasma processing apparatus comprising:
a processing chamber that plasma-processes a processed substrate;
a plasma generating unit that generates plasma in the processing chamber;
a wafer stage which is mounted in the processing chamber and has an electrostatic chuck for holding the processed substrate;
a DC power supply that applies an electrostatic attraction voltage to the electrostatic chuck;
a current detector that detects a current value of leakage current flowing between the electrostatic chuck and the processed substrate;
an applied voltage controlling unit which sets an attraction condition to the leakage to the leakage current value to control the voltage applied to the electrostatic chuck and the applied time so that the leakage current has a set current value; and
an attraction characteristic acquiring unit that acquires and stores a relationship between the leakage current and the applied voltage during the processing and displays the result;
wherein the attraction characteristic acquiring unit has a function for acquiring the relationship between the leakage current value and the applied voltage, calculating a difference thereof from a reference value, and storing and displaying information concerning the difference.

6. A plasma processing apparatus comprising:
a processing chamber that plasma-processes a processed substrate;
a plasma generating unit that generates plasma in the processing chamber;
a wafer which is mounted in the processing chamber and has an electrostatic chuck for holding the processed substrate;
a DC power supply that applies an electrostatic attraction voltage to the electrostatic chuck;
a current detector that detects a current value of leakage current flowing between the electrostatic chuck and the processed substrate;
an applied voltage controlling unit which sets an attraction condition to the leakage current value to control the voltage applied to the electrostatic chuck and the applied time so that the leakage current has a set current value; and
an attraction characteristic acquiring unit that acquires and stores a relationship between the leakage current and the applied voltage during the processing and displays the result;
wherein the attraction characteristic acquiring unit has a function for setting a allowable value of the difference from the set value and a function for issuing an alarm if the difference exceeds the allowable value.

7. A method of plasma-processing a substrate using a plasma processing apparatus comprising:
a processing chamber that plasma-processes a processed substrate;
a plasma generating unit that generates plasma in the processing chamber;
a wafer stage which is mounted in the processing chamber and has an electrostatic chuck for holding the processed substrate;
a DC power supply that applies an electrostatic attraction voltage to the electrostatic chuck;
a current detector that detects a current value of leakage current flowing between the electrostatic chuck and the processed substrate;
an applied voltage controlling unit which sets an attraction conditions to the leakage current values to control the voltage applied to the electrostatic chuck so that the leakage current has a set current value; and
an attraction characteristic acquiring unit that acquires and stores a relationship between the leakage current and the applied voltage during the processing and displays the result;
the method comprising the step of setting the leakage current value during the substrate processing time using the substrate and selecting the applied voltage having the current value.

* * * * *